United States Patent
Ho et al.

(10) Patent No.: US 11,811,131 B2
(45) Date of Patent: Nov. 7, 2023

(54) ANTENNA MODULE (71) Applicant: Advanced Semiconductor Engineering, Inc., Kaohsiung (TW)

(72) Inventors: Cheng-Yu Ho, Kaohsiung (TW); Meng-Wei Hsieh, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 379 days.

(21) Appl. No.: 17/133,358

(22) Filed: Dec. 23, 2020

(65) Prior Publication Data
US 2022/0200129 A1    Jun. 23, 2022

(51) Int. Cl.
 *H01Q 1/22* (2006.01)
 *H01L 23/31* (2006.01)
 *H01L 23/538* (2006.01)
 *H01L 23/00* (2006.01)
 *H01L 21/48* (2006.01)
 *H01Q 1/48* (2006.01)
 *H01L 23/66* (2006.01)

(52) U.S. Cl.
 CPC ........ *H01Q 1/2283* (2013.01); *H01L 21/4853* (2013.01); *H01L 23/3128* (2013.01); *H01L 23/5383* (2013.01); *H01L 23/5386* (2013.01); *H01L 23/5389* (2013.01); *H01L 23/66* (2013.01); *H01L 24/20* (2013.01); *H01Q 1/48* (2013.01); *H01L 2223/6677* (2013.01); *H01L 2224/214* (2013.01)

(58) Field of Classification Search
 CPC ...... H01Q 1/2283; H01Q 1/48; H01Q 21/065; H01Q 1/40; H01L 21/4853; H01L 23/3128; H01L 23/5383; H01L 23/5386; H01L 23/5389; H01L 23/66; H01L 24/20; H01L 2223/6677; H01L 2224/214; H01L 23/16; H01L 2224/16225; H01L 2224/18; H01L 23/49816
 See application file for complete search history.

(56) References Cited

U.S. PATENT DOCUMENTS

| | | | |
|---|---|---|---|
| 2017/0033062 A1* | 2/2017 | Liu | ................. H01L 23/528 |
| 2019/0221917 A1* | 7/2019 | Kim | ................. H01Q 1/2283 |
| 2020/0243441 A1 | 7/2020 | Hsiao et al. | |

FOREIGN PATENT DOCUMENTS

CN    112310003 A   *  2/2021  ........... H01L 21/565

* cited by examiner

Primary Examiner — Daniel D Chang
(74) Attorney, Agent, or Firm — FOLEY & LARDNER LLP (57) ABSTRACT

The present disclosure provides an antenna module. The antenna module includes an antenna layer, a ground layer, and an electronic component. The ground layer is disposed over the antenna layer. The electronic component is disposed between the antenna layer and the ground layer.

13 Claims, 9 Drawing Sheets

ANTENNA MODULE

BACKGROUND

1. Technical Field

The present disclosure relates to a semiconductor device package and a method of manufacturing the same, and more particularly to a semiconductor device package including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design.

SUMMARY

In accordance with some embodiments of the present disclosure, an antenna module includes an antenna layer, a ground layer, and an electronic component. The ground layer is disposed over the antenna layer. The electronic component is disposed between the antenna layer and the ground layer.

In accordance with some embodiments of the present disclosure, an antenna module includes an antenna layer, a ground layer, and an electronic component. The ground layer and the antenna layer defines a coupling space. The electronic component is disposed within the coupling space.

In accordance with some embodiments of the present disclosure, a method of manufacturing an antenna module includes (a) providing an antenna layer and an electronic component disposed above the antenna layer; and (b) forming a ground layer over the electronic component. The ground layer is separated from the antenna layer by the electronic component.

Common reference numerals are used throughout the drawings and the detailed description to indicate the same or similar components. The present disclosure will be readily understood from the following detailed description taken in conjunction with the accompanying drawings.

DETAILED DESCRIPTION

Figure 1:
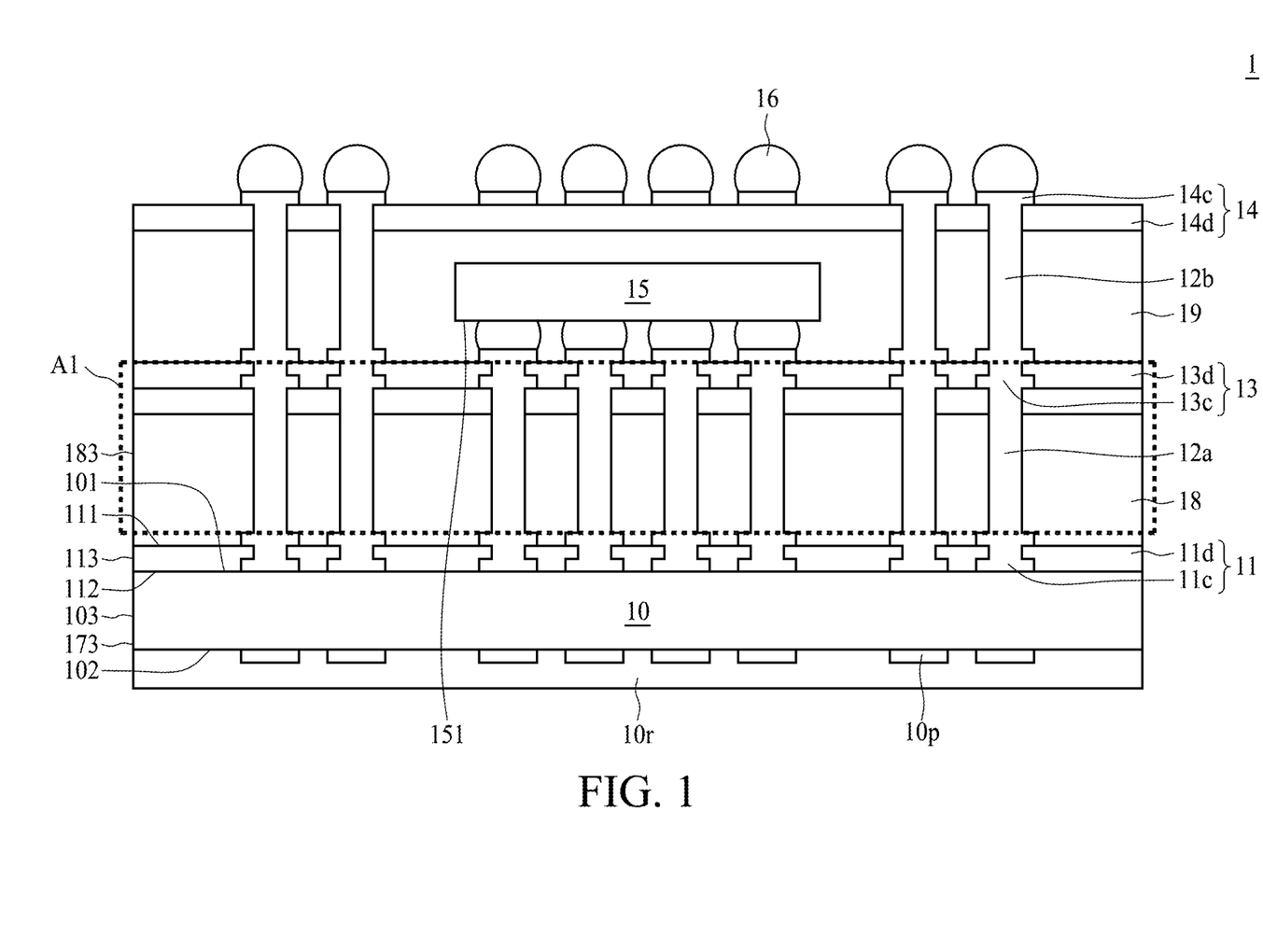
FIG. 1 illustrates a cross-sectional view of a semiconductor device package, in accordance with some embodiments of the present disclosure.

FIG. 1 illustrates a cross-sectional view of a semiconductor device package 1, in accordance with some embodiments of the present disclosure. The semiconductor device package 1 includes a carrier 10, circuit layers 11, 13, 14, interconnection structures 12a, 12b, an electronic component 15, electrical contacts 16, and package bodies 18 and 19. In some embodiments, the semiconductor device package 1 can be referred to as an antenna module.

In some embodiments, the carrier 10 (also can be referred to as a stand-off layer) may be or include a glass substrate. In some embodiments, the carrier 10 may be or include an emitting device having one or more emitting components (e.g., an antenna, a light emitting device, a sensor or the like) disposed thereon. The carrier 10 may include conductive pad(s), trace(s), and interconnection(s) (e.g. via(s)). In some embodiments, the carrier 10 may include transparent material. In some embodiments, the carrier 10 may include opaque material. Compared to the organic substrate, it is easier to control the thickness of a glass carrier, which can facilitate the miniaturization of the semiconductor device package 1. The carrier 10 includes a material having a dielectric constant (Dk) less than approximately 5. The carrier 10 includes a material having a Dk less than approximately 3. The carrier 10 includes a material having a loss tangent or dissipation factor (Df) less than approximately 0.005. The carrier 10 includes a material having a loss tangent or Df less than approximately 0.003. In some embodiments, the thickness of the carrier 10 is about 400 µm.

The carrier 10 has a surface 101, a surface 102 opposite to the surface 101 and a lateral surface 103 extending between the surface 101 and the surface 102. A conductive layer 10p is disposed on the surface 102 of the carrier 10. In some embodiments, the conductive layer 10p defines an antenna layer, which may include a directional antenna, an omnidirectional antenna, an antenna array. For example, the conductive layer 10p defines a patch antenna. The conductive layer 10p is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof. In some embodiments, the conductive layer 10p may be replaced by one or more light emitting devices or sensors.

A protection layer 10r is disposed on the surface 102 of the carrier 10 to cover the conductive layer 10p. In some embodiments, the projection layer 10r may be formed or include a dielectric material, such as pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In other embodiments, the projection layer 10r may be omitted.

The circuit layer 11 (or building-up circuit) is disposed on the surface 101 of the carrier 10. The circuit layer 11 has a surface 111 facing away from the carrier 10, a surface 112 opposite to the surface 111 and a lateral surface 113 extending between the surface 111 and the surface 112. The surface 112 is in contact with the surface 101 of the carrier 10. In some embodiments, the lateral surface 113 of the circuit layer 11 is coplanar with the lateral surface 103 of the carrier 10. In other embodiments, the lateral surface 113 of the circuit layer 11 and the lateral surface 103 of the carrier 10 are noncoplanar or discontinuous. For example, the lateral surface 103 of the carrier 10 may be recessed from the lateral surface 113 of the circuit layer 11.

The circuit layer 11 includes one or more conductive layers (e.g., redistribution layers, RDLs) 11c and one or more dielectric layers 11d. A portion of the conductive layer 11c is covered or encapsulated by the dielectric layer 11d while another portion of the conductive layer 11c is exposed from the dielectric layer 11d to provide electrical connections. In some embodiments, a surface of the conductive layer 11c facing the carrier 10 and exposed from the dielectric layer 11d is in contact with the surface 101 of the carrier 10. In some embodiments, the conductive layer 11c may be or include one or more antenna patterns, light emitting devices, sensors or the like.

In some embodiments, the dielectric layer 11d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of conductive layers 11c and dielectric layers 11d depending on design specifications. In some embodiments, the conductive layer 11c is formed of or includes Au, Ag, Cu, Pt, Pd, or an alloy thereof.

One or more interconnection structures 12a (e.g., conductive pillars or conductive elements) are disposed on the surface 111 of the circuit layer 11. The interconnection structures 12a are electrically connected to the circuit layer 11 (i.e., to the conductive layer 11c exposed from the dielectric layer 11d). In some embodiments, the interconnection structures 12a define an antenna structure. In some embodiments, the interconnection structures 12a may function as feeding line of the antenna (e.g., the conductive layer 11c). The interconnection structure 12a is, or includes, a conductive material such as a metal or metal alloy. Examples of the conductive material include Au, Ag, Cu, Pt, Pd, or an alloy thereof.

The package body 18 is disposed on the surface 111 of the circuit layer 11. The package body 18 covers the interconnection structures 12a. In some embodiments, the package body 18 has a lateral surface 183 substantially coplanar with the lateral surface 113 of the circuit layer 11. In some embodiments, the package body 18 includes an epoxy resin including fillers, a molding compound (e.g., an epoxy molding compound or other molding compound), a polyimide, a phenolic compound or material, a material including a silicone dispersed therein, or a combination thereof.

The circuit layer 13 (or building-up circuit) is disposed on the package body 18. The circuit layer 13 has one or more dielectric layers 13d and one or more conductive layers 13c. In some embodiments, the dielectric layer 13d may include the same material as the dielectric layer 11d. Alternatively, the dielectric layer 13d and the dielectric layer 11d may include different materials. The conductive layer 13c is electrically connected to the interconnection structures 12a. In some embodiments, there may be any number of conductive layers 13c and dielectric layers 13d depending on design specifications.

One or more interconnection structures 12b (e.g., conductive pillars or conductive elements) are disposed on a surface of the circuit layer 13 facing away from the circuit layer 11. The interconnection structures 12b are electrically connected to the circuit layer 13. The interconnection structure 12b is, or includes, a conductive material such as a metal or metal alloy. Examples of the conductive material include Au, Ag, Cu, Pt, Pd, or an alloy thereof.

The electronic component 15 is disposed on a surface of the circuit layer 13 facing away from the circuit layer 11. The electronic component 15 may be an active electronic component, such as an integrated circuit (IC) chip or a die. The electronic component 15 has an active surface 151 facing the circuit layer 13. The electronic component 15 is electrically connected to the circuit layer 13 (e.g., to the conductive layer 13c) through electrical contacts 15p (e.g., conductive pillars, solder bumps, solder balls, or the like), and the electrical connection can be achieved by, for example, flip-chip technique.

The package body 19 is disposed on the surface of the circuit layer 13 facing away from the circuit layer 11. The package body 19 covers the interconnection structures 12b and the electronic component 15. In some embodiments, the package body 19 has a lateral surface substantially coplanar with the lateral surface of the circuit layer 13. In some embodiments, the package body 19 includes an epoxy resin including fillers, a molding compound (e.g., an epoxy molding compound or other molding compound), a polyimide, a phenolic compound or material, a material including a silicone dispersed therein, or a combination thereof. In some embodiments, the package body 19 may include a dielectric material, such as pre-impregnated composite fibers (e.g., pre-preg), BPSG, silicon oxide, silicon nitride, silicon oxynitride, USG, any combination of two or more thereof, or the like.

The circuit layer 14 (or building-up circuit) is disposed on the package body 19. The circuit layer 14 has one or more dielectric layers 14d and one or more conductive layers 14c. In some embodiments, the dielectric layer 14d may include the same material as the dielectric layer 11d. Alternatively, the dielectric layer 14d and the dielectric layer 11d may include different materials. The conductive layer 14c is electrically connected to the interconnection structures 12b. In some embodiments, there may be any number of conductive layers 14c and dielectric layers 14d depending on design specifications.

The electrical contacts 16 are disposed on the conductive layer 14c exposed from the dielectric layer 14d. In some embodiments, the electrical contacts 16 may include solder or other suitable material(s).

In some embodiments, the package body 18 may be omitted, and the active surface 151 of the electronic component 15 can be closer to the antenna (e.g., the conductive layer 11c). However, parasitic capacitors between the electronic component 15 and the antenna would adversely affect the performance of the antenna. To achieve a better performance (e.g., a higher gain of the antenna), a distance between the active surface 151 of the electronic component 15 and the antenna (e.g., the conductive layer 11c) should meet a requirement (e.g., equal to or greater than 200 μm). Hence, the package body 18 with a relatively great thickness is required. This increases the total thickness of the semiconductor device package 1 and hinders the miniaturization of the semiconductor device package 1.

Figure 2:
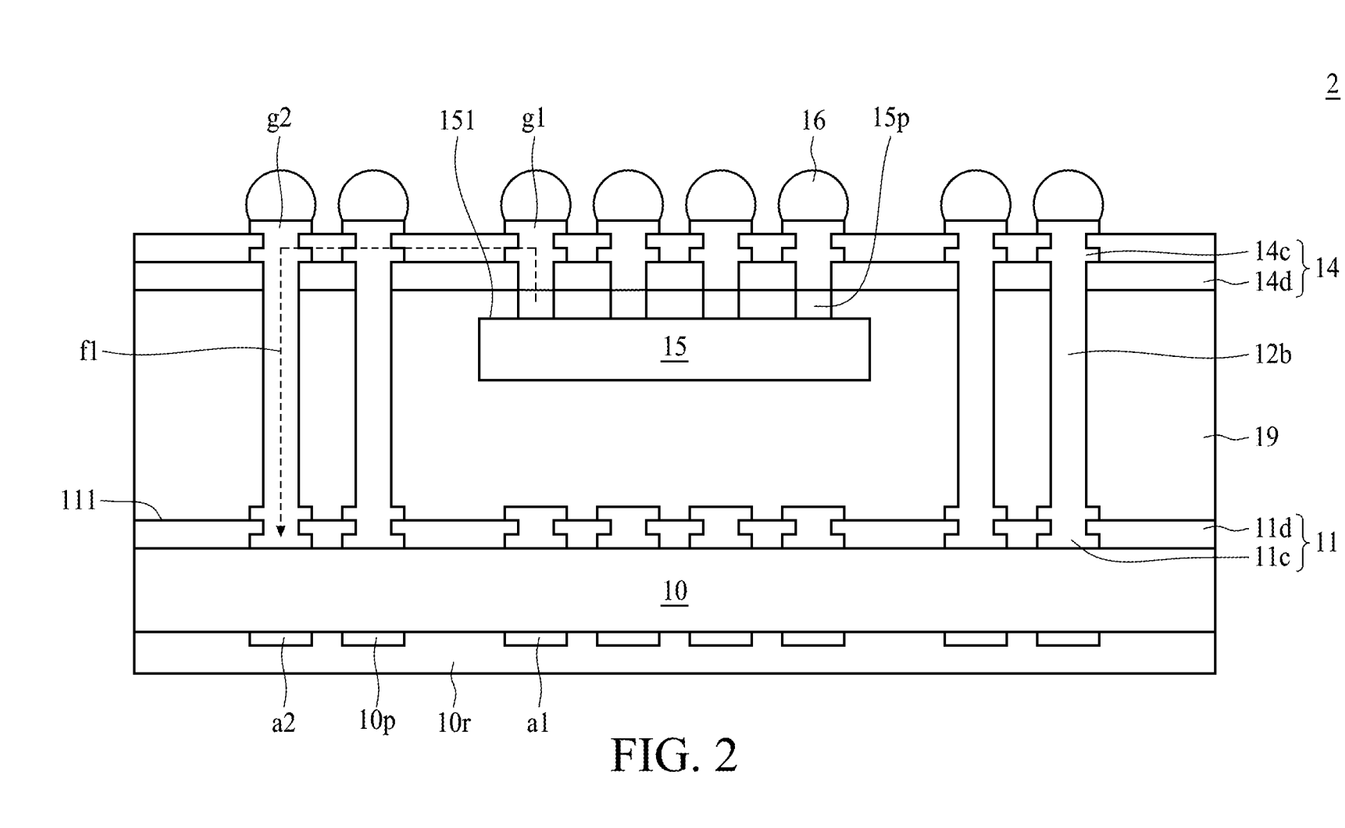
FIG. 2 illustrates a cross-sectional view of a semiconductor device package, in accordance with some embodiments of the present disclosure.

FIG. 2 illustrates a cross-sectional view of a semiconductor device package 2, in accordance with some embodiments of the present disclosure. The semiconductor device package 2 is similar to the semiconductor device package 1 as shown in FIG. 1, and some of the differences therebetween are described below.

The structures encircled by a dotted-line box A1 as shown in FIG. 1 are omitted. For example, the package body 18, the circuit layer 13, and the interconnection structures 12a as shown in FIG. 1 are omitted. The interconnection structures 12b are disposed on the surface 111 of the circuit layer 11. The interconnection structures 12b are electrically connected to the circuit layer 11 (i.e., to the conductive layer 11c exposed from the dielectric layer 11d). In some embodiments, the interconnection structures 12b define an antenna structure. In some embodiments, the interconnection structures 12b may function as feeding line of the antenna (e.g., the conductive layer 11c).

The active surface 151 of the electronic component 15 faces away from the carrier 10. The active surface 151 of the electronic component 15 faces the circuit layer 14. The electronic component 15 is electrically connected to the circuit layer 14 (e.g., to the conductive layer 14c) through electrical contacts (e.g., solder balls, solder bumps, conductive pillars or the like). The electronic component 15 is spaced apart from the circuit layer 11.

The package body 19 is disposed on the surface 111 of the circuit layer 11. The package body 19 covers the interconnection structures 12b and the electronic component 15.

In some embodiments, the conductive layer 10p (e.g., the antenna layer) includes a plurality of antennas a1, a2 (or antenna patterns). A portion of the conductive layer 14c may function as a ground layer (or a reference ground layer) for the corresponding antenna. For example, as shown in FIG. 2, the conductive layer g1 can function as the ground layer (or the reference ground layer) for the corresponding antenna a1, and the conductive layer g2 can function as the ground layer (or the reference ground layer) for the corresponding antenna a2. In some embodiments, the ground layers g1, g2 can function as a resonance space for signal coupling between the electronic component 15 and the antenna layer (e.g., the conductive layer 10p). For example, the conductive layer 10p and/or the conductive layer 11c (e.g., antenna layer) and the conductive layer 14c (e.g., ground layer) may define a coupling space. The electronic component 15 and the interconnection structure 12b are disposed within the coupling space.

As shown in FIG. 2, the signal (e.g., RF signal) can be transmitted from the active surface 151 of the electronic component 15 to the conductive layer 11c along the path f1 through the feeding line (e.g., interconnection structure 12b), and the signal can be coupled to the antenna a2 for emission or radiation. The signal transmitted from the electronic component 15 to the antenna a2 would pass the ground layer g2 first and then reach the antenna a2. In other words, a distance between the electronic component 15 (e.g., the active surface 151 of the electronic component 15) and the ground layer g2 is less than a distance between the electronic component 15 (e.g., the active surface 151 of the electronic component 15) and the antenna a2. This can reduce the loss of the signal transmitted between the electronic component 15 and the antenna layer (e.g., the conductive layer 10p), which can increase the gain of the antenna layer (e.g., the conductive layer 10p) without increasing the thickness of the semiconductor device package 2 (compared with the semiconductor device package 1). In other embodiments, the interconnection structure 12b can be omitted. The signal transmission between the conductive layer 14c and the conductive layer 11c can be achieved through electromagnetically coupling. In this case, the conductive via electrically connected between the electrical contact 15p of the electronic component 15 and the conductive layer 14c may function as a feeding line.

Figure 3A:
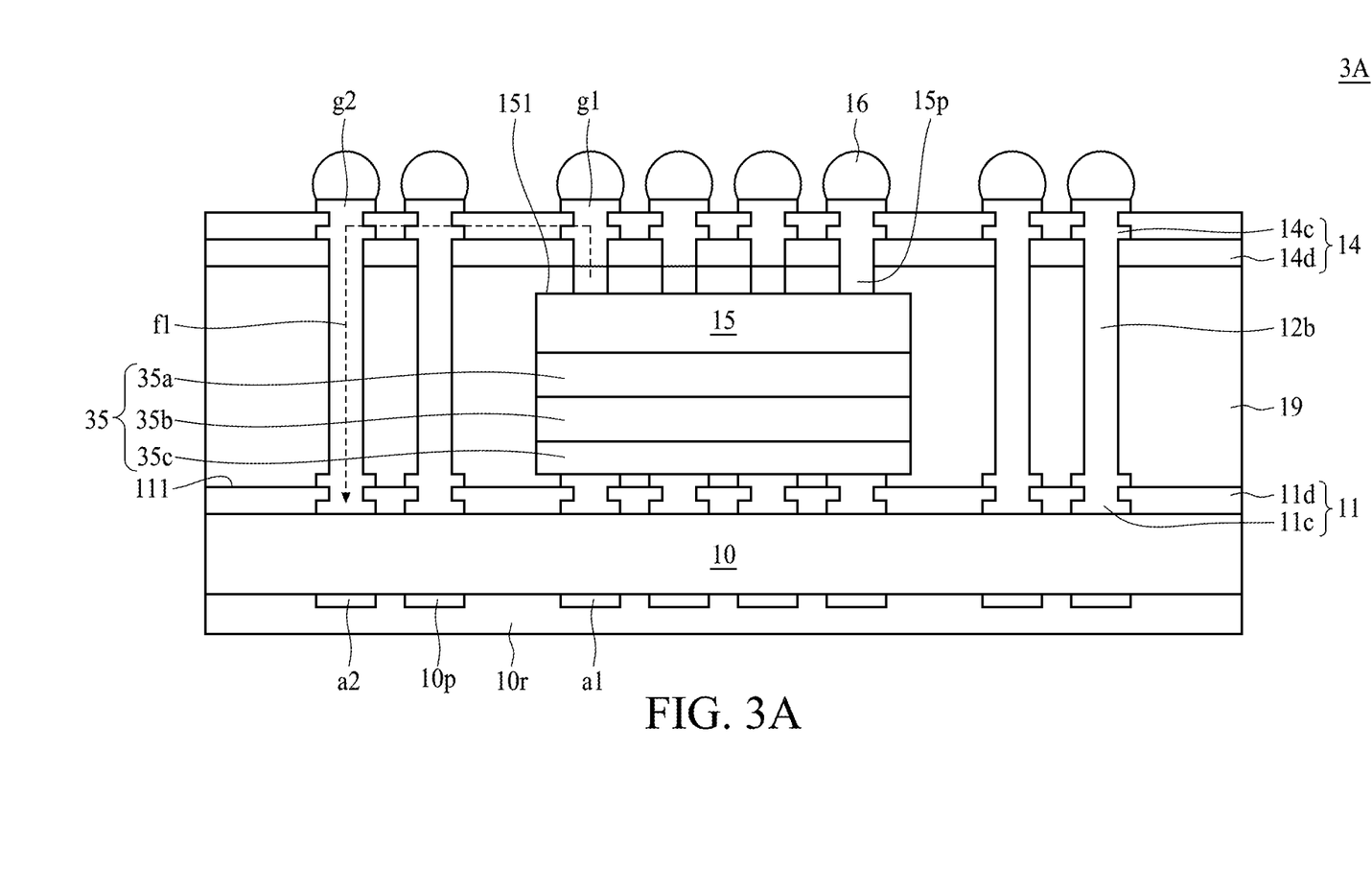
FIG. 3A illustrates a cross-sectional view of a semiconductor device package, in accordance with some embodiments of the present disclosure.

FIG. 3A illustrates a cross-sectional view of a semiconductor device package 3A, in accordance with some embodiments of the present disclosure. The semiconductor device package 3A is similar to the semiconductor device package 2 as shown in FIG. 2, except that the semiconductor device package 3A further includes a spacer 35 disposed between a backside surface of the electronic component 15 and the circuit layer 11.

In some embodiments, the spacer 35 is in contact with the backside surface of the electronic component 15 and the circuit layer 11. The spacer 35 can provide support to the electronic component 15. In some embodiments, the spacer 35 includes a carrier 35b and adhesive layers 35a, 35c (e.g., tape or die attach film (DAF)). The carrier 35b is connected to the backside surface of the electronic component 15 through the adhesive layer 35a. The carrier 35b is connected to the circuit layer 11 through the adhesive layer 35c. In some embodiments, the carrier 35b may include a glass substrate or any other rigid materials.

In some embodiments, the electronic component 15 can be thinned to increase the distance between the electronic component 15 and the antenna layer (e.g., the conductive layer 10p), which can in turn increase the gain of the antenna layer. However, as the thickness of the electronic component 15 decreases, the electronic component 15 may be bent or damaged (e.g., crack or break) during the manufacturing process. By using the spacer 35 to support the electronic component 15, the above issues can be solved.

Figure 3B:
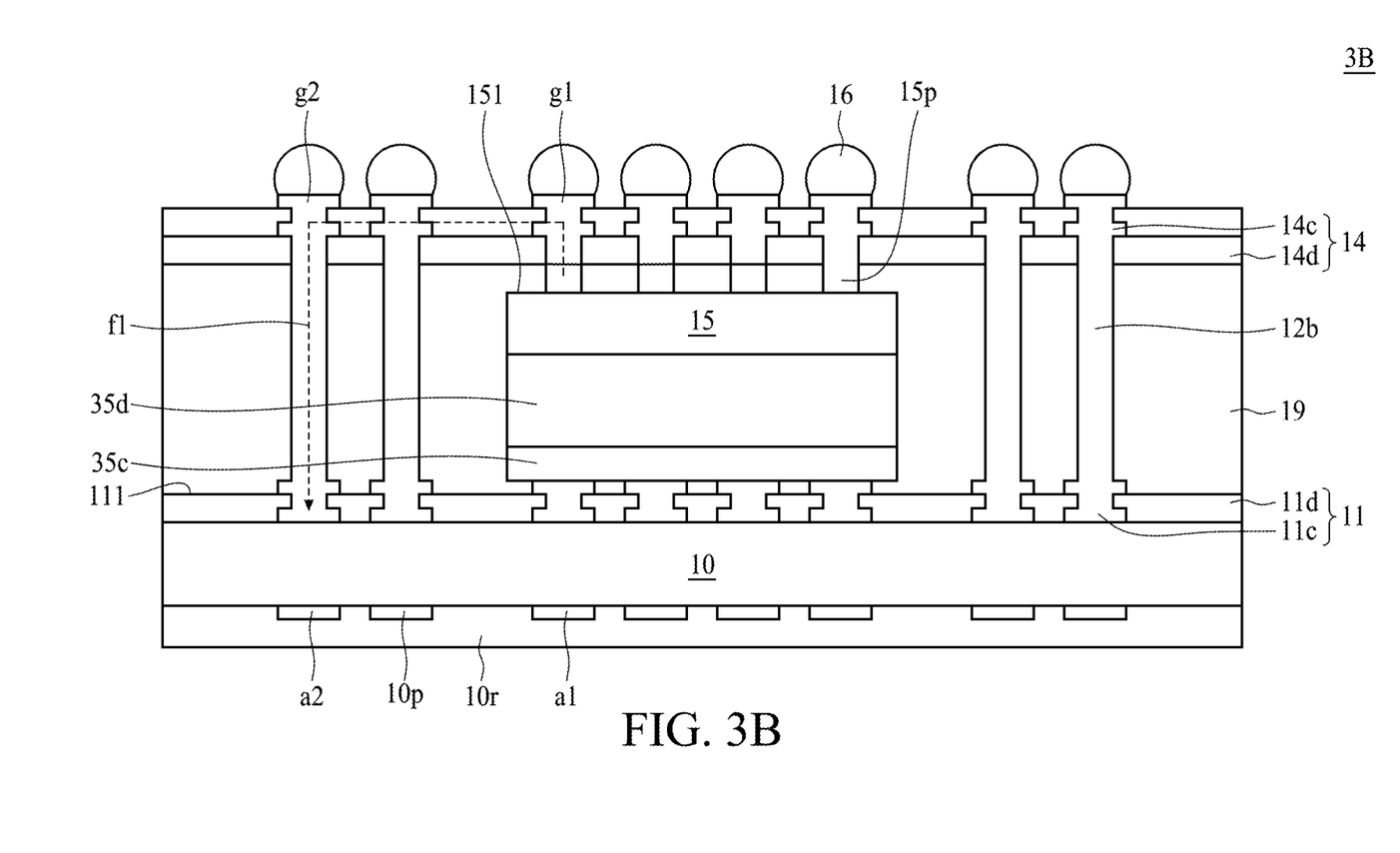
FIG. 3B illustrates a cross-sectional view of a semiconductor device package, in accordance with some embodiments of the present disclosure.

FIG. 3B illustrates a cross-sectional view of a semiconductor device package 3B, in accordance with some embodiments of the present disclosure. The semiconductor device package 3B is similar to the semiconductor device package 3A as shown in FIG. 3A, except that in FIG. 3B, the carrier 35b and the adhesive layer 35a as illustrated in FIG. 3A are replaced by a package body 35d.

The package body 35d may include a molding compound with fillers. The package body 35d is in contact with the backside surface of the electronic component 15. The package body 35d connects the electronic component 15 to the adhesive layer 35c.

FIG. 4A, FIG. 4B, FIG. 4C, FIG. 4D, FIG. 4E, and FIG. 4F illustrate a semiconductor manufacturing method, in accordance with some embodiments of the present disclosure. In some embodiments, the method in FIG. 4A, FIG. 4B, FIG. 4C, FIG. 4D, FIG. 4E, and FIG. 4F can be used to manufacture a portion of the semiconductor device package 3B in FIG. 3B.

Figure 4A:
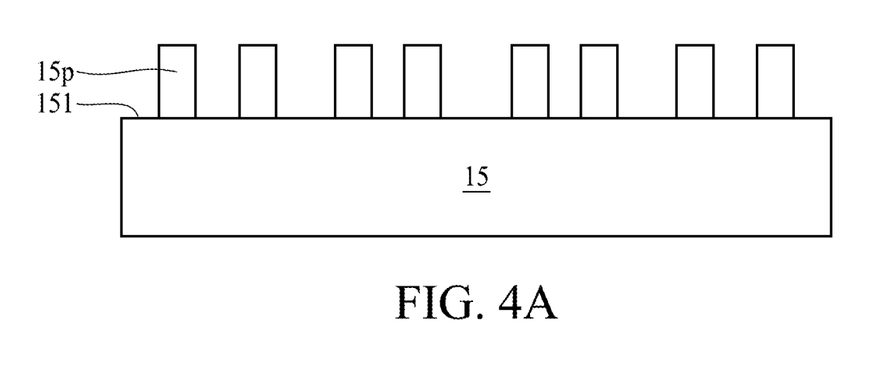
FIG. 4A, FIG. 4B, FIG. 4C, FIG. 4D, FIG. 4E, and FIG. 4F illustrate a semiconductor manufacturing method in accordance with some embodiments of the present disclosure.

Referring to FIG. 4A, a plurality of electronic components including the electronic component 15 are provided. The electronic components may be in the form of a wafer, a strip, a panel or the like. One or more electrical contacts 15p (conductive pillars, solder bumps, solder balls or the like) are disposed on an active surface 151 of each electronic component to provide electrical connections.

Figure 4B:
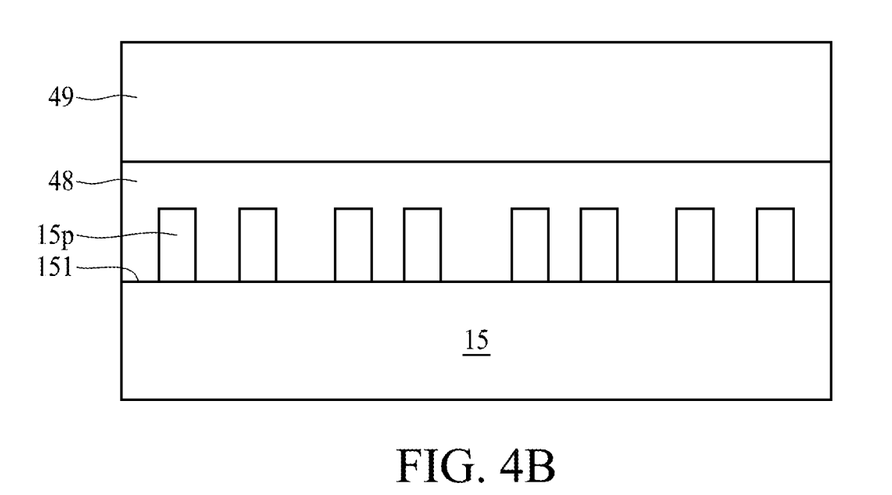

Referring to FIG. 4B, a protection layer 48 (e.g., glue) 48 is disposed on the active surface 151 of the electronic component 15 and covers the electrical contacts 15p. A carrier 49 is disposed on the protection layer 48 and connected to the protection layer 48.

Figure 4C:
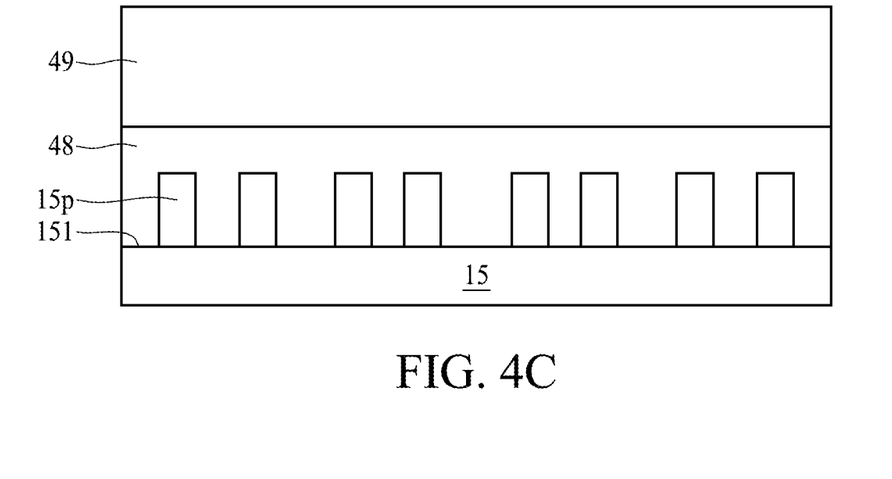

Referring to FIG. 4C, a thinning operation is carried out from the backside surface of the electronic components including the electronic component 15 to reduce the thickness of each electronic component by, for example, grinding or any other suitable techniques.

Figure 4D:
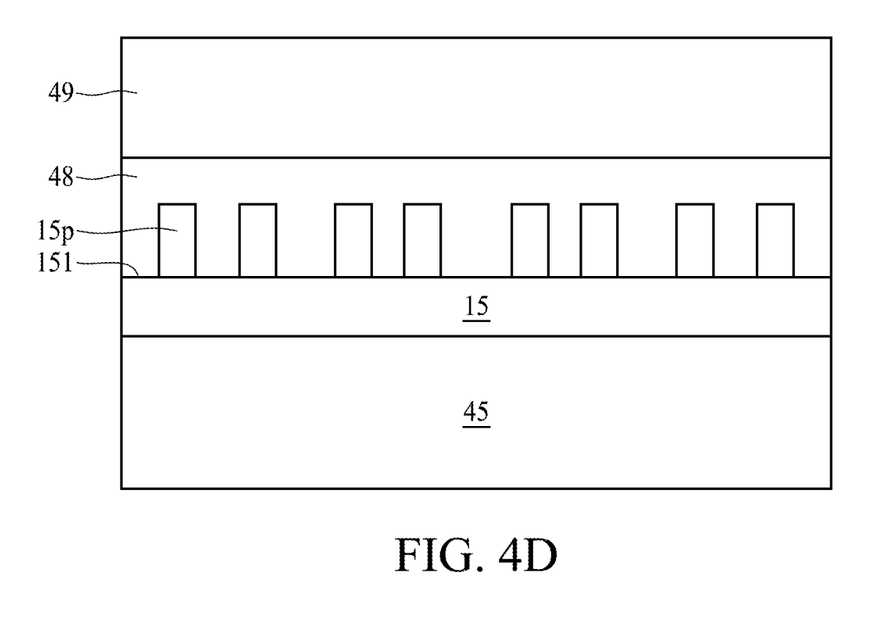

Referring to FIG. 4D, a support structure 45 is formed on the backside surface of the electronic components including the electronic component 15. The support structure 45 is the same as or similar to the package body 35d as shown in FIG. 3B. In some embodiments, the support structure 45 may be directly connected to the backside surface of the electronic components including the electronic component 15.

Figure 4E:
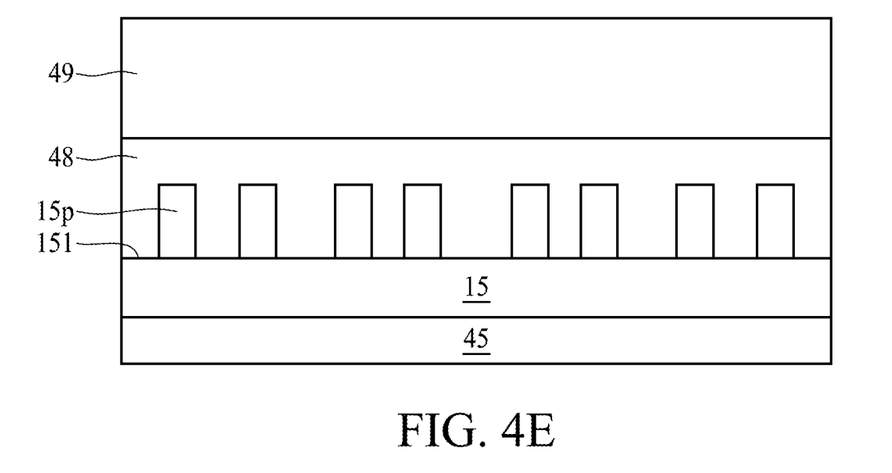

Referring to FIG. 4E, a thinning operation is carried out from a surface of the support structure 45 facing away from the electronic components to reduce the thickness of the support structure 45 by, for example, grinding or any other suitable techniques.

Figure 4F:
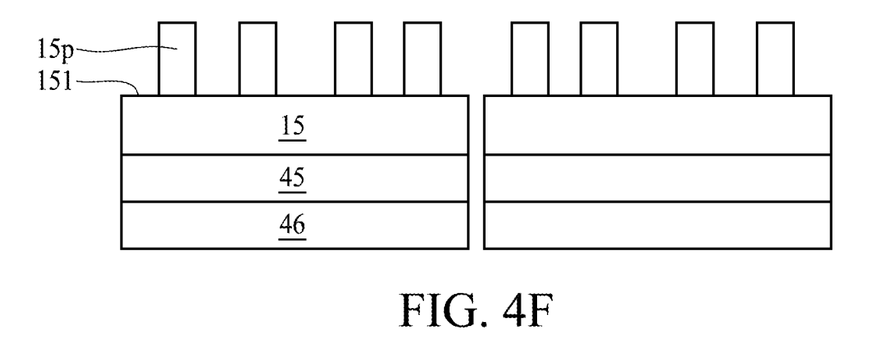

Referring to FIG. 4F, an adhesive layer 46 is formed on the support structure 45, and the protection layer 48 and the carrier 49 are removed from the electronic components. The adhesive layer 46 is the same as or similar to the adhesive layer 35c as shown in FIG. 3B. Singulation may be performed to separate out individual structures. That is, the singulation is performed through the electronic components including the electronic component 15, the support element 45, and the adhesive layer 46. The singulation may be performed, for example, by using a dicing saw, laser or other appropriate cutting technique.

In some embodiments, the semiconductor device package 3B as shown in FIG. 3B may be formed by the following operations: (i) providing a structure including the carrier 10 having the conductive layer 10p and the circuit layer 11 on both surfaces of the carrier 10; (ii) bonding (or connecting) the individual structure as shown in FIG. 4F to the circuit layer 11 with the adhesive layer 46 attached to the circuit layer 11; (iii) forming the interconnection structures 12b electrically connecting to the circuit layer 11; (iv) forming the package body 19 to cover the electronic component 15 and the interconnection structures 12b; (v) removing a portion of the package body 19 to expose a top surface of the interconnection structures 12b and a top surface of the electrical contacts 15p; (vi) forming the circuit layer 14 on the package body 19 and electrically connected to the exposed portion of the interconnection structures 12b and the electrical contacts 15p; and (vii) forming electrical contacts 16 on the circuit layers 14.

Figure 5A:
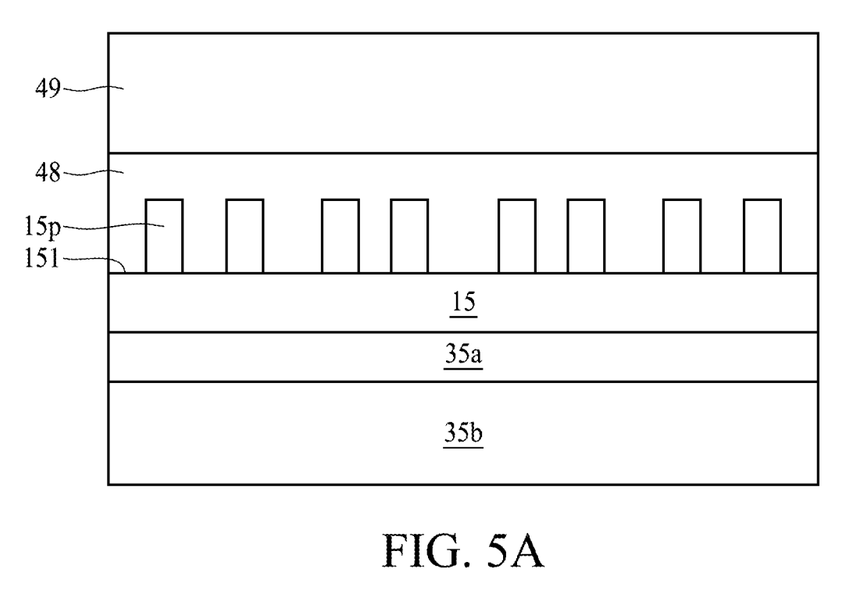
FIG. 5A, FIG. 5B, and FIG. 5C illustrate a semiconductor manufacturing method in accordance with some embodiments of the present disclosure.
Figure 5B:
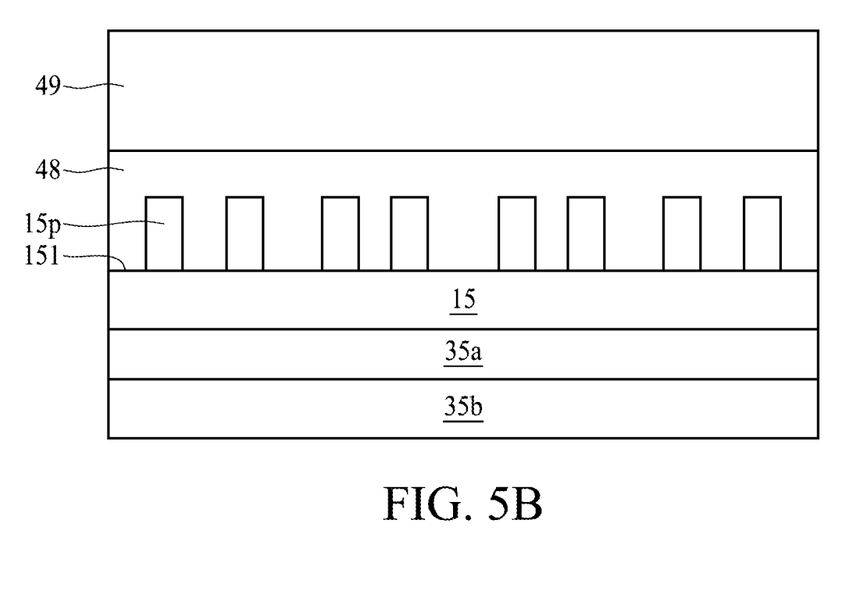
Figure 5C:
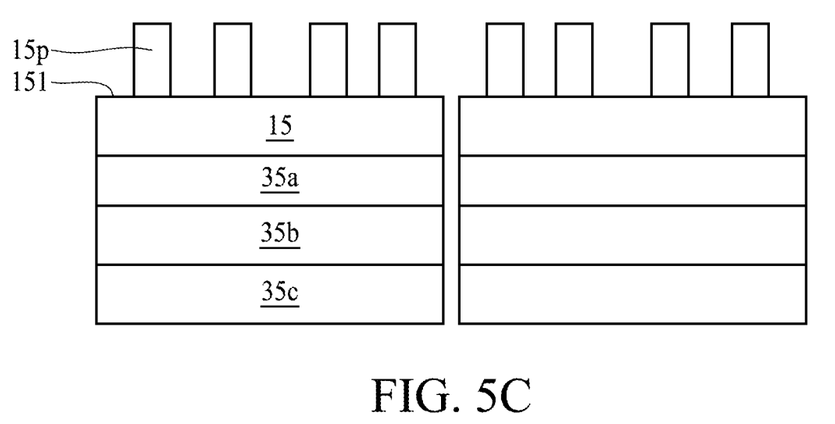

FIG. 5A, FIG. 5B, and FIG. 5C illustrate a semiconductor manufacturing method, in accordance with some embodiments of the present disclosure. In some embodiments, the method in FIG. 5A, FIG. 5B, and FIG. 5C can be used to manufacture a portion of the semiconductor device package 3A in FIG. 3A. In some embodiments, the operations illustrated in FIG. 5A may be carried out after the operations illustrated in FIG. 4C.

Referring to FIG. 5A, an adhesive layer 35a is connected to the backside surface of the electronic components including the electronic component 15. A carrier 35b is then connected to the adhesive layer 35a.

Referring to FIG. 5B, a thinning operation is carried out from a surface of the carrier 35b facing away from the electronic components to reduce the thickness of the carrier 35b by, for example, grinding or any other suitable techniques.

Referring to FIG. 5C, an adhesive layer 35c is connected to the carrier 35b, and the protection layer 48 and the carrier 49 are removed from the electronic components. Singulation may be performed to separate out individual structures. That is, the singulation is performed through the electronic components including the electronic component 15, the carrier 35b, and the adhesive layers 35a, 35c. The singulation may be performed, for example, by using a dicing saw, laser or other appropriate cutting technique.

In some embodiments, the semiconductor device package 3A as shown in FIG. 3A may be formed by the following operations: (i) providing a structure including the carrier 10 having the conductive layer 10p and the circuit layer 11 on both surfaces of the carrier 10; (ii) bonding (or connecting) the individual structure as shown in FIG. 5C to the circuit layer 11 with the adhesive layer 35c attached to the circuit layer 11; (iii) forming the interconnection structures 12b electrically connecting to the circuit layer 11; (iv) forming the package body 19 to cover the electronic component 15 and the interconnection structures 12b; (v) removing a portion of the package body 19 to expose a top surface of the interconnection structures 12b and a top surface of the electrical contacts 15p; (vi) forming the circuit layer 14 on the package body 19 and electrically connected to the exposed portion of the interconnection structures 12b and the electrical contacts 15p; and (vii) forming electrical contacts 16 on the circuit layers 14.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An antenna module, comprising:
an antenna layer;
a ground layer disposed over the antenna layer; and
an electronic component disposed between the antenna layer and the ground layer,
wherein the ground layer includes a reference ground layer with respect to the antenna layer.

2. The antenna module of claim 1, wherein the electronic component is closer to the ground layer than the antenna layer.

3. The antenna module of claim 1, further comprising a circuit structure including a conductive layer and the ground layer, wherein the electronic component is configured to transmit a signal to the antenna layer through the conductive layer.

4. The antenna module of claim 3, further comprising an interconnection structure connecting the conductive layer to the antenna layer.

5. The antenna module of claim 1, further comprising a spacer disposed between the electronic component and the antenna layer.

6. The antenna module of claim 5, wherein the spacer includes a dielectric layer and a first adhesive layer.

7. The antenna module of claim 6, wherein the dielectric layer includes a molding compound with fillers, and the molding compound connects the electronic component to the first adhesive layer.

8. The antenna module of claim 6, further comprising a second adhesive layer, wherein the first adhesive layer is disposed between the dielectric layer and the electronic component, and the second adhesive layer is disposed between the dielectric layer and the antenna layer.

9. The antenna module of claim 1, further comprising a package body disposed between the antenna layer and the ground layer, wherein the package body covers the electronic component.

10. The antenna module of claim 1, wherein the electronic component has an active surface and a backside surface closer to the antenna layer than the active surface.

11. The antenna module of claim 1, wherein the ground layer and the antenna layer define a coupling space for signal transmission between the electronic component and the antenna layer.

12. An antenna module, comprising:
an antenna layer;
a ground layer disposed over the antenna layer;
an electronic component disposed between the antenna layer and the ground layer; and
a spacer disposed between the electronic component and the antenna layer, wherein the spacer includes a dielectric layer and an adhesive layer.

13. An antenna module, comprising:
an antenna layer;
a ground layer disposed over the antenna layer; and
an electronic component disposed between the antenna layer and the ground layer,
wherein the electronic component has an active surface and a backside surface closer to the antenna layer than the active surface.

* * * * *